(12) United States Patent
Chen et al.

(10) Patent No.: US 6,366,435 B1
(45) Date of Patent: Apr. 2, 2002

(54) MULTIPLE SOURCES ESD PROTECTION FOR AN EPITAXY WAFER SUBSTRATE

(75) Inventors: Shiao-Shien Chen, Chung-Li; Tien-Hao Tang, Taipei Hsien, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/498,540

(22) Filed: Feb. 4, 2000

(51) Int. Cl.[7] .............................. H02H 3/22; H02H 9/00
(52) U.S. Cl. ................................... 361/56; 361/111
(58) Field of Search ........................ 361/56, 54, 111; 257/355

(56) References Cited

U.S. PATENT DOCUMENTS

| | | | | |
|---|---|---|---|---|
| 5,272,586 A | * | 12/1993 | Yen | 361/111 |
| 5,945,713 A | * | 8/1999 | Voldman | 257/355 |
| 6,002,568 A | * | 12/1999 | Ker et al. | 361/111 |
| 6,011,681 A | * | 1/2000 | Ker et al. | 361/111 |
| 6,028,758 A | * | 2/2000 | Sharpe-Geisler | 361/111 |
| 6,034,552 A | * | 3/2000 | Chang et al. | 326/83 |
| 6,075,686 A | * | 6/2000 | Ker | 361/56 |
| 6,091,595 A | * | 7/2000 | Sharpe-Geisler | 361/111 |
| 6,140,682 A | * | 10/2000 | Liu et al. | 257/355 |

* cited by examiner

Primary Examiner—Josie Ballato
Assistant Examiner—Kim Huynh
(74) Attorney, Agent, or Firm—Thomas, Kayden, Horstemeyer & Risley

(57) ABSTRACT

A multiple sources electrostatic discharge protection circuit. The protection circuit is applicable for being used in both N-type and P-type substrate of epitaxy wafer. Employing the concept of charge couple, while electrostatic discharge occurs, the parasitic bipolar carriers of a transistor to provide a discharge path is turned on in advance under both the conditions of applying a positive stress to the ground or a negative stress to a voltage source pad. In addition, by applying the electrostatic discharge stress to the ground voltage or the voltage source, the drawback of the conventional electrostatic discharge charge couple protection circuit can be resolved to greatly enhance the protection effect.

4 Claims, 4 Drawing Sheets

US 6,366,435 B1

MULTIPLE SOURCES ESD PROTECTION FOR AN EPITAXY WAFER SUBSTRATE

BACKGROUND OF THE INVENTION

1. Field of the Invention

The invention relates in general to an electrostatic discharge (ESD) protection circuit More particularly, this invention relates to a multiple sources electrostatic discharge protection circuit applicable for being used in an epitaxy wafer.

2. Description of the Related Art

In a fabrication process of an integrated circuit (IC) such as a dynamic random access memory (DRAM) or a static random access memory (SRAM), or after the chip is fabricated, the electrostatic discharge is the major cause to damage the intetrated circuit. For example, when a human being walking on a blanket, in an environment with a high relative humidity (HR), the human being may carry from hundreds to thousands of electrostatic voltages. When the relative humidity is low, more than ten thousand of electrostatic voltages may be carried. In case the carried electrostatic charges are in contact with the chip, the chip is easily damaged to malfunction. To avoid the electrostatic discharge damage, various electrostatic protection methods or apparatus are developed. A very common type of electrostatic protection is to design an on-chip electrostatic discharge protection circuit between the internal circuit and each pad.

However, as the size of the integrated circuits reduces as the increase of the integration, the breakdown voltage of the gate oxide is approaching the junction breakdown voltage of the source/drain region, or even lower. The performance of the electrostatic discharge protection circuit is thus greatly deteriorated. In addition, the internal circuit is typically designed according to the minimum design rules without a proper design to withstand a huge electrostatic discharge transient current. For example, the space between the contact window and the edge diffusion region and between the contact window and the edge of the gate is designed insufficiently large. Under a high integration, the chip is easily to be damaged by the electrostatic discharge. Therefore, the electrostatic discharge has become a major cause to damage the deep submicron integrated circuit.

FIG. 1 shows a circuit diagram of a conventional electrostatic discharge circuit. In FIG. 1, an electrostatic electricity entering from an I/O pad 10 can be connected to an earth line Vss to discharge via the N-type metal-oxide semiconductor (NMOS) transistor 12. Or alternatively, the electrostatic electricity can also be discharged to a voltage source Vdd via the PMOS transistor 14. In both manners, the internal circuit 16 can be protected.

FIG. 2 shows a cross-sectional view of a protection circuit as shown in FIG. 1 being constructed on a P-type (P+) epitaxy wafer (epi-wafer).

When the protection circuit as shown in FIG. 1 is constructed on the P+epi-wafer as shown in FIG. 2, the influence upon the PMOS 14 due the low resistance of the P+ epi-wafer 18 is smaller with the N-well 20 as an isolation from the epi-wafer 18. For the NMOS 12, a current to trigger a lateral NPN transistor 22 is greatly increased being affected by the low resistant P+ epi-wafer 18. That is, it requires a larger current to turn on the lateral NPN transistor 22. In addition, as the thickness of the epitaxial layer becomes thinner, the influence is bigger. The protection effect of the electrostatic discharge protection circuit is thus discounted. Similarly, for the N+epi-wafer, the protection performance of the PMOS is greatly deteriorated. Thus, the circuit construction has to be modified while being built up on an epi-wafer.

FIG. 3 shows a circuit diagram of a conventional electrostatic charge couple protection circuit. The electrostatic couple protection circuit 40 comprising two NMOS transistors 46, 48 and two PMOS transistors 50, 52 are disposed between the pad 42 and the internal circuit 44. The NMOS transistor 46 has a source region coupled to ground (the ground voltage Vss), a gate coupled to a drain region of the NMOS transistor 48, and a drain region coupled to the I/O pad 42. A source region of the NMOS transistor 48 is coupled to the ground voltage Vss, while a gate of thereof is coupled to a voltage source Vdd. The PMOS transistor 50 has a source region coupled to the voltage source Vdd, a gate coupled to a drain region of the PMOS transistor 52, and a drain region coupled to the I/O pad 42. A source region of the PMOS transistor 52 is coupled to the voltage source Vdd, and a gate thereof is coupled to the ground voltage Vss.

Under a normal operation, since the gate of the NMOS transistor 48 and the gate of the PMOS transistor 52 are coupled to the voltage source Vdd and the ground voltage Vss, respectively, the NMOS transistor 48 and the PMOS transistor 52 are both turned on. Meanwhile, the gates of both the NMOS transistor 46 and the PMOS transistor 50 are in a non-floating state to turn off the transistors of NMOS 46 and the PMOS 50. Therefore, under the normal operation status, there are no charge couple characteristics and leakage current paths.

However, when electrostatic discharge occurs, taking the positive stress to Vss an example, since the voltage source Vdd is in a floating state (under abnormal operation state), the NMOS transistor 48 is turned off. During a transient period, the NMOS transistor 46 is turned off, while the gate thereof is in a floating state. The positive stress input from the I/O pad 42 is coupled to the gate of the NMOS transistor 46 via the parasitic capacitor 54 between the drain region and gate of the NMOS transistor 46. Therefore, the parasitic bipolar device of the NMOS transistor 46 is turned on in advance. The positive stress voltage from the I/O pad 42 can thus discharge to the ground voltage Vss via the NMOS transistor 46.

However, as the parasitic diode 56 of the PMOS transistor 50 is experienced a forward bias, the positive stress voltage from the I/O pad 42 is delivered to the gate of the NMOS transistor 48 being transferring from the parasitic diode 56 to the voltage source Vdd. The NMOS transistor 48 is thus turned on to deteriorated the characteristics of charge couple. The electrostatic discharge protection effect is thus degraded. The same conditions and effects are also applied to a negative stress to Vdd.

SUMMARY OF THE INVENTION

The invention provides a multiple sources electrostatic discharge protection circuit applicable for being used on a P-type substrate of epitaxy wafer. The multiple sources electrostatic discharge protection circuit is disposed between an I/O pad and an internal circuit and comprises four NMOS transistors and two PMOS transistors. The first NMOS transistor comprises a drain region coupled to the I/O pad and a gate coupled to a first voltage source. The second NMOS transistor comprises a drain region coupled to a source region of the first NMOS transistor and a gate coupled to a second voltage source. The third NMOS transistor comprises a drain region coupled to a voltage source pad and a gate coupled to the first voltage source. The fourth NMOS transistor comprises a drain region coupled to a source region of the third NMOS transistor and a gate coupled to the second voltage source. The first PMOS comprises a source region coupled to the I/O pad, a gate coupled to a source region of the second NMOS transistor and a drain region coupled to the ground voltage. The second PMOS transistor comprises a source region coupled to the voltage source pad, a gate coupled to a source region of the fourth NMOS transistor and a drain region coupled to the I/O pad. The voltage source pad is coupled to either the first or the second voltage source.

The invention further provides a multiple source electrostatic discharge protection circuit applicable for being used on an N-type substrate of epitaxy wafer. The multiple source electrostatic discharge protection circuit is disposed between an I/O pad and an internal circuit and comprises six NMOS transistors. The first NMOS transistor comprises a gate coupled to a first voltage source. The second NMOS transistor comprises a drain region coupled to a source region of the first NMOS transistor, a gate coupled to a second voltage source and a source region coupled to a ground voltage. The third NMOS transistor comprises a gate coupled to the first voltage source. The fourth NMOS transistor comprises a drain region coupled to a source region of the third NMOS transistor, a gate coupled to the second voltage source and a source region coupled to the ground voltage. The fifth NMOS transistor comprises a drain region coupled to the I/O pad, a gate coupled to a drain region of the first NMOS transistor and a source region coupled to the ground voltage. The sixth NMOS transistor comprises a drain region coupled to the voltage source pad, a gate coupled to a drain region of the third NMOS transistor and a source region coupled to the I/O pad. The voltage source pad is coupled to either the first or the second voltage source.

The multiple sources electrostatic discharge protection circuit provided by the invention can thus be used for N-type or P-type substrate of epitaxy wafer. The concept of charge couple is applied when the electrostatic discharge occurs. As a result, no matter whether a positive stress is connected to a ground voltage or a negative stress is connected to a voltage source pad, the discharge path is provided by a parasitic bipolar device of a transistor that is turned on in advance. The electrostatic discharge protection is greatly enhanced.

Both the foregoing general description and the following detailed description are exemplary and explanatory only and are not restrictive of the invention, as claimed.

DESCRIPTION OF THE PREFERRED EMBODIMENTS

Figure 1:
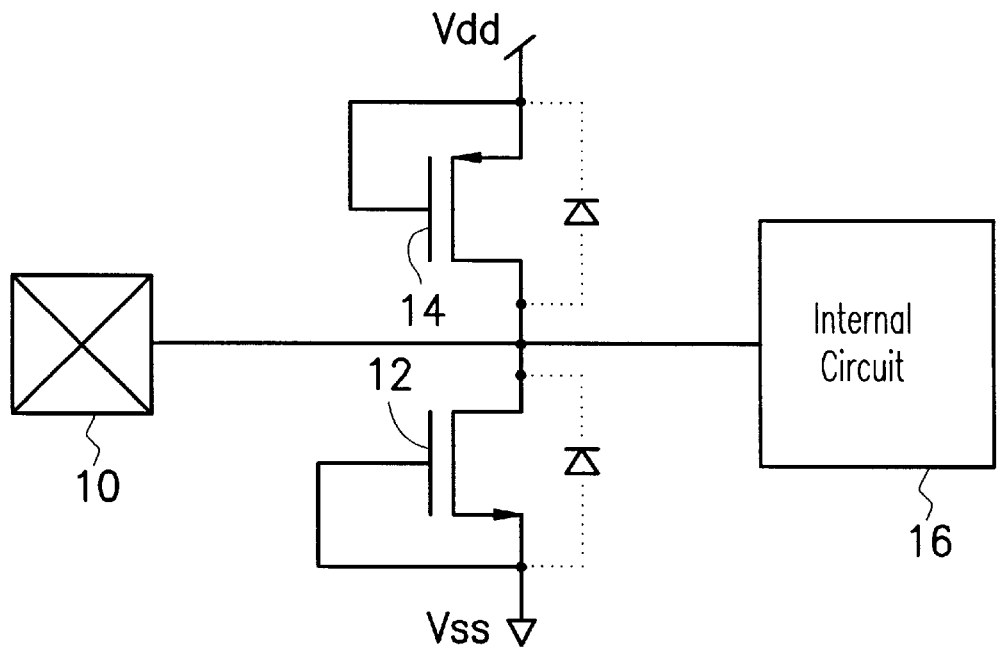
FIG. 1 shows a circuit diagram of a conventional electrostatic discharge protection circuit.
Figure 2:
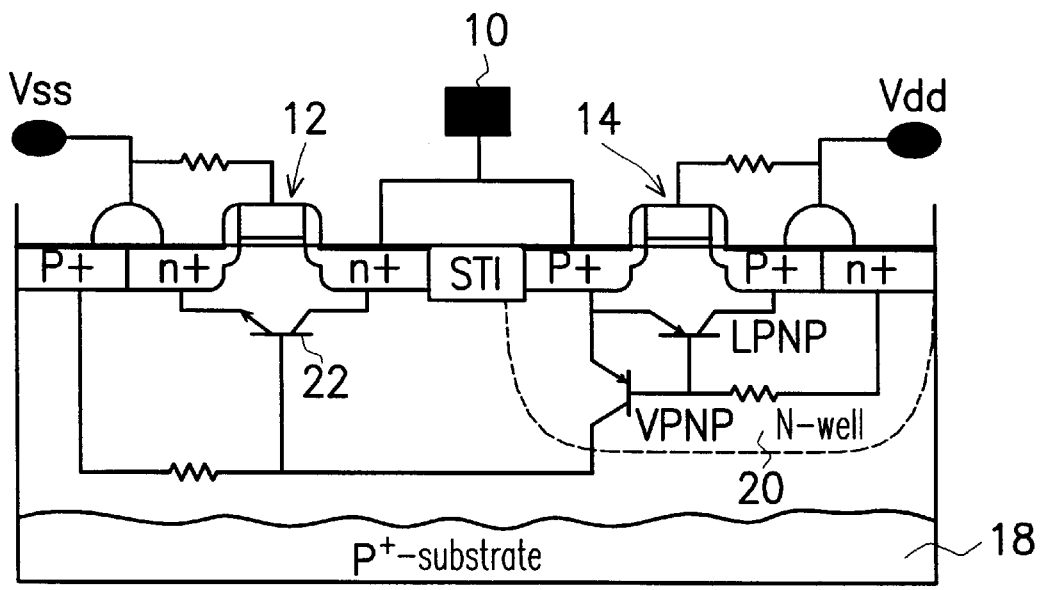
FIG. 2 is a cross sectional view showing the electrostatic discharge protection circuit as shown in FIG. 1 built on an epitaxy wafer.
Figure 3:
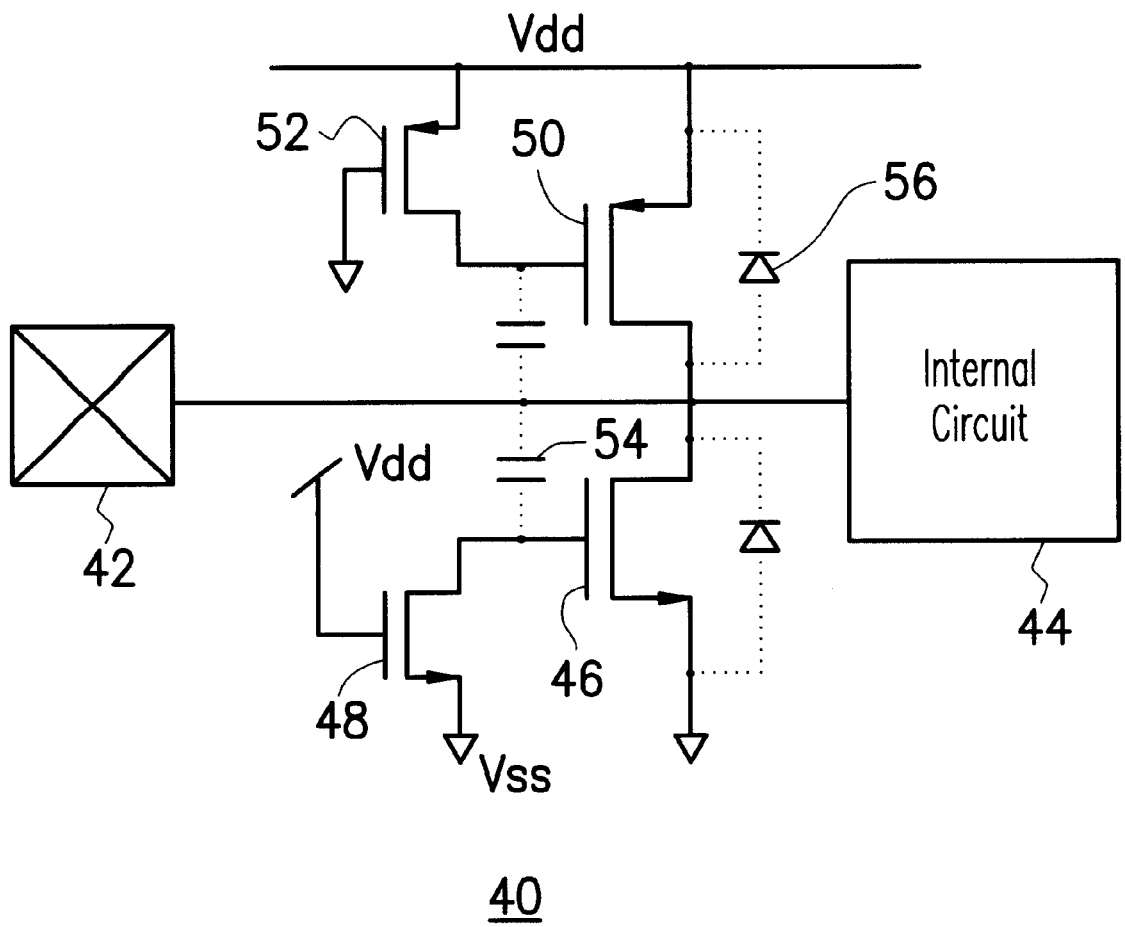
FIG. 3 shows a circuit diagram of a conventional electrostatic discharge protection charge couple protection circuit.
Figure 4:
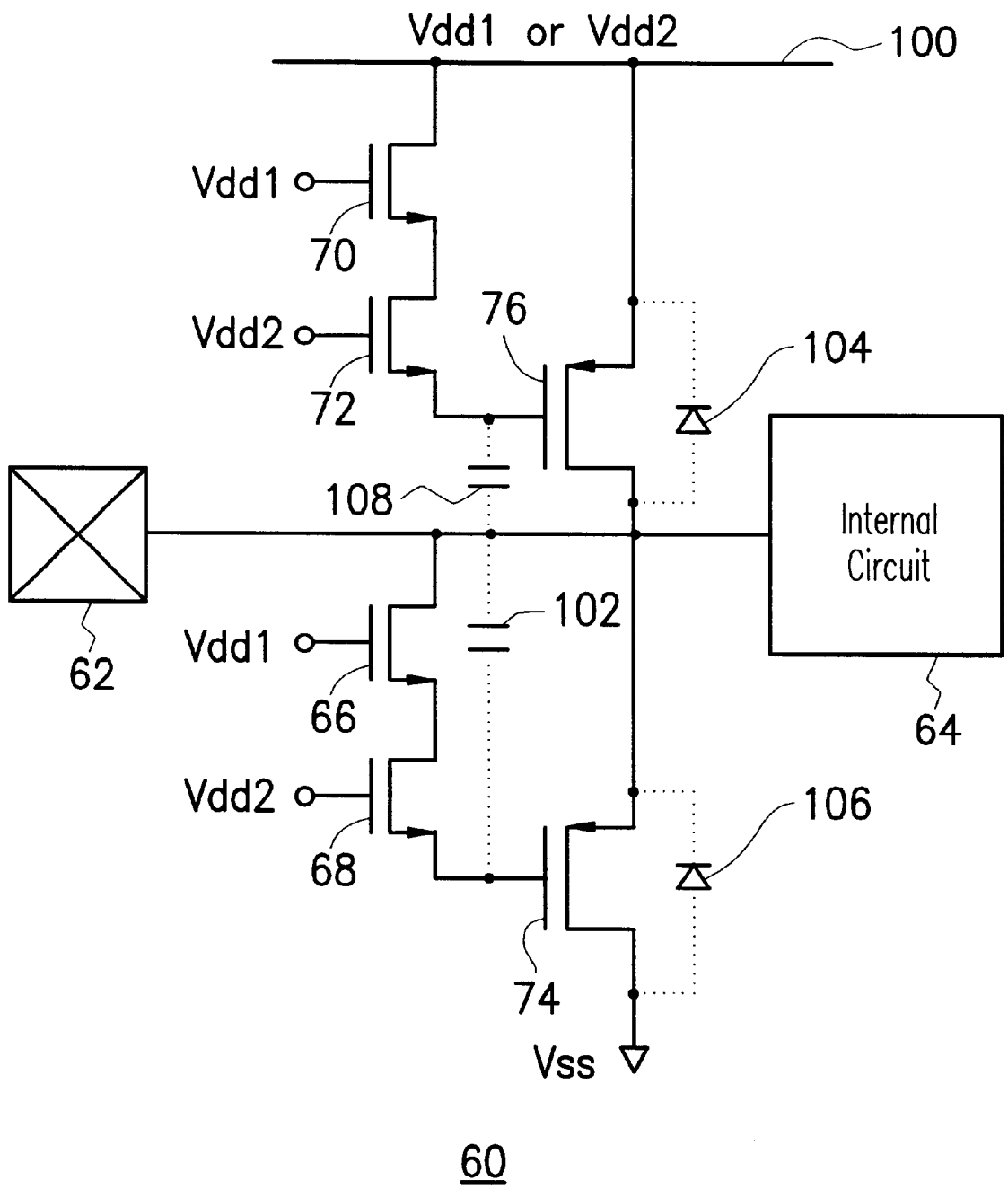
FIG. 4 shows a multiple sources electrostatic discharge protection circuit according to the invention.

In FIG. 4, a circuit diagram of a first embodiment of a multiple sources electrostatic discharge protection circuit applicable for being used for a P-type (P+) epitaxy wafer is shown.

In FIG. 4, the multiple sources electrostatic discharge protection circuit 60 is disposed between an I/O pad 62 and an internal circuit 64. The multiple sources electrostatic discharge protection circuit 60 comprises four NMOS transistors 66, 68, 70, 72 and two PMOS transistors 74 and 76. The connection relationship is introduced as follows. The NMOS transistor 66 has a drain region coupled to the I/O pad 62, a gate coupled to a first voltage source Vdd1 and a source region coupled to a drain region of the NMOS transistor 68. The NMOS transistor 68 further comprises a gate coupled to a second voltage source Vdd2 and a source region coupled to a gate of the PMOS transistor 74. The NMOS transistor 70 has a drain region coupled to a voltage source pad 100, a gate coupled to the first voltage source Vdd1 and a source region coupled to a drain region of the NMOS transistor 72. The voltage source pad 100 may also be coupled to the first or the second voltage source Vdd1 or Vdd2. The NMOS transistor 72 further comprises a gate coupled to the second voltage source Vdd2 and a source region coupled to a gate of the PMOS transistor 76. A source region of the PMOS transistor 74 is coupled to the I/O pad 62, and a drain region of the PMOS transistor 74 is coupled to the ground voltage Vss. The PMOS transistor 76 comprises a source region coupled to the voltage source pad 100 and a drain region coupled to the I/O pad 62.

Under a normal operation condition, both the gates of the NMOS transistors 66 and 70 are coupled to the first voltage source Vdd1 and both the gates of the NMOS transistors 68 and 72 are coupled to the second voltage source Vdd2. Therefore, under the normal operation condition, the charge couple characteristics are not existent, and the PMOS transistors 74 and 76 are turned off.

When electrostatic occurs, taking a positive stress to Vss as an example, the first voltage source Vdd1, the second voltage source Vdd2 and the voltage source pad 100 (that is, Vdd1 or Vdd2) are in floating state (under an abnormal operation condition), so that the NMOS transistors 66 and 68 are turned off. As a result, in a transient period of time, the PMOS transistor 74 is turned off and the gate is in a floating state. When the positive stress voltage is input from the I/O pad 62, the parasitic bipolar device of the PMOS transistor 74 is turned on in advance by coupling to the gate of the PMOS transistor 74 via the parasitic capacitor 102 between the source region and the gate of the PMOS transistor 74. The positive stress voltage from the I/O pad 62 can thus be discharged to the ground voltage Vss via the PMOS transistor 74.

On the other hand, due the forward biased characteristics of the parasitic diode 104 of the PMOS transistor 76, the positive stress voltage from the I/O pad 62 is coupled from the parasitic diode 104 to the voltage source pad 100. That is, the parasitic diode 104 PMOS transistor 76 provides a voltage couple path.

The positive stress voltage directed to the voltage source pad 100 is further conducted to the gate of the NMOS transistor 66 or the gate of the NMOS transistor 68 (depending on whether the voltage source pad 100 is coupled to the first voltage source Vdd1 or the second voltage source Vdd2). That is, even with the coupling effect of the parasitic diode 104, there is only one of the NMOS transistors 66 and 68 to be turned on without affecting the state of the PMOS transistor 74. The PMOS transistor 74 is thus in the floating state. Thus, according to the invention, the charge couple characteristics of the parasitic capacitor 102 can be used to turn on the parasitic bipolar device in advance to enhance the protection performance of electrostatic discharge.

The same result occurs to the application of negative stress to the voltage source pad. When the electrostatic discharge of a negative stress occurs, the parasitic diode 106 of the PMOS transistor 76 provides a path for voltage couple. However, the couple effect of the parasitic diode 106 does not affect the NMOS transistors 70 and 72. The gate of the PMOS transistor 76 is still in a floating state. Therefore, according to the structure of the first embodiment, the charge couple characteristic of the parasitic capacitor 108 between the drain region and the gate of the PMOS transistor 76 is applied to turn on the parasitic bipolar device of the PMOS transistor 76 in advance. The protection performance of the electrostatic discharge is effectively enhanced.

It is worth noting that the multiple sources electrostatic discharge protection circuit can be formed on a P-type epitaxy wafer. Since both the PMOS transistors 74 and 76 have N-well for isolation, therefore, the effect of P+ epi-wafer upon of the PMOS transistors 74 and 76 is minimized. In addition, the invention uses the concept of charge couple to greatly enhance the protection performance. During the implantation step for electrostatic static discharge (ESD implant), the PMOS transistors 74 and 76 that can use an identical photomask, so that the ESD robustness for both Vss and Vdd is enhanced.

Figure 5:
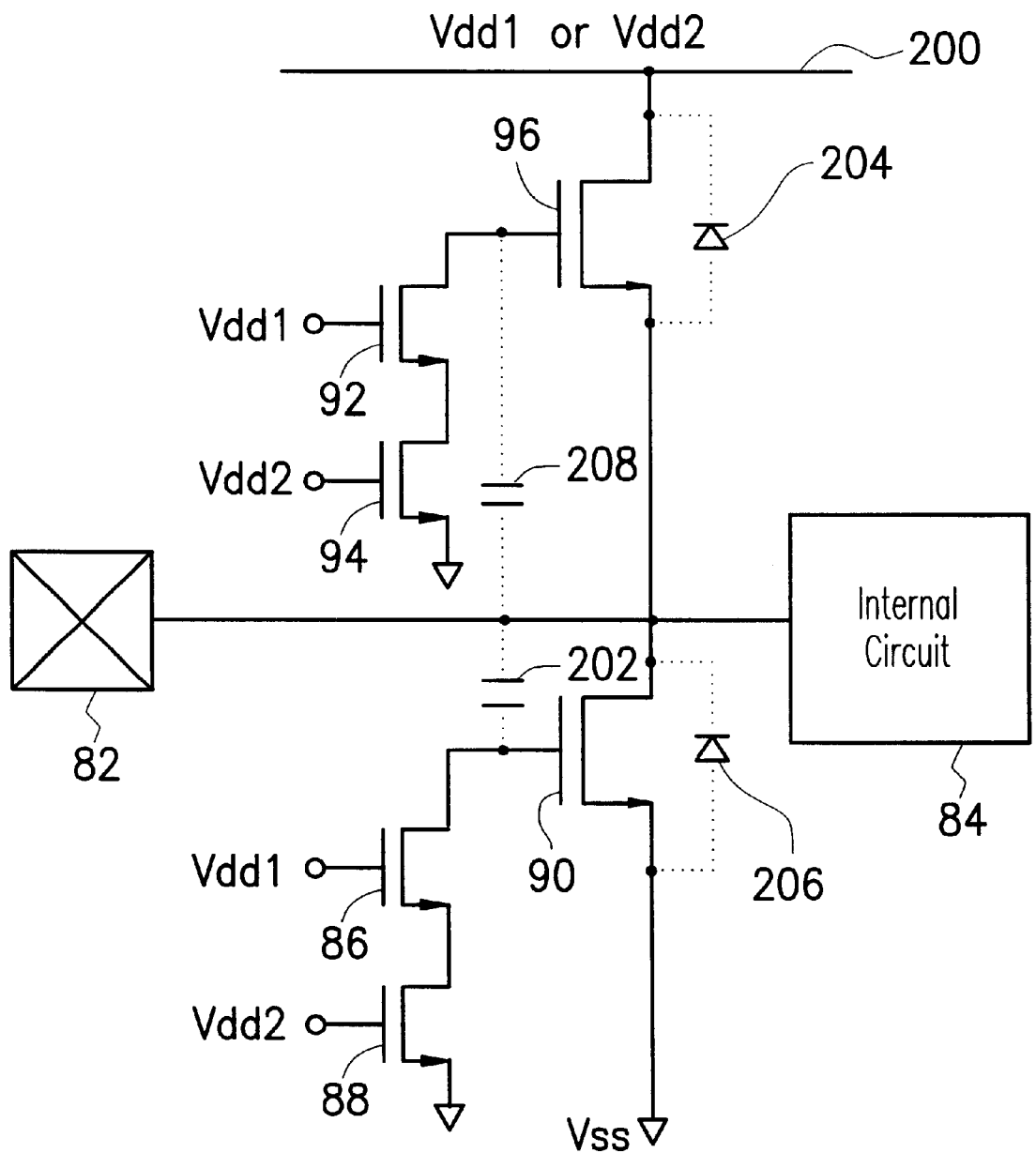
FIG. 5 shows another example of a multiple sources electrostatic discharge protection circuit according to the invention.

FIG. 5 shows a circuit diagram of a multiple sources electrostatic discharge protection circuit in a second embodiment of the invention. The protection circuit is applicable for being used in an N-type epitaxy wafer.

In FIG. 5, a multiple sources electrostatic discharge protection circuit is disposed between the I/O pad 82 and the internal circuit 84. The multiple sources electrostatic discharge protection circuit 80 comprises six NMOS transistors 86, 88, 90, 92, 94 and 96. The NMOS transistor 86 comprises a drain region coupled to a gate of the NMOS transistor 90, a gate coupled to a first voltage source Vdd1 and a source region coupled to a drain region of the NMOS transistor 88. The NMOS transistor 88 comprises a gate coupled to a second voltage source Vdd2 and a source region coupled to the ground voltage Vss. The NMOS transistor 90 comprises a drain region coupled to the I/O pad 82 and a source region coupled to the ground voltage source Vss. The NMOS transistor 92 comprises a drain region coupled to a gate of the NMOS transistor 96, a gate coupled to the first voltage source Vdd1 and a source region coupled to a drain region of the NMOS transistor 94. The NMOS transistor 94 comprises further a gate coupled to the second voltage source Vdd2 and a source region coupled to the ground voltage Vss. The NMOS transistor 96 comprises a drain region coupled to voltage source pad 200 and a source region coupled to the I/O pad 82. The voltage source pad 200 is coupled to either the first voltage source Vdd1 or the second voltage source Vdd2.

Under a normal operation, the gates of the NMOS transistors 86 and 92 are both coupled to the first voltage source Vdd1, and both the gates of the NMOS transistors 88 and 94 are coupled to the second voltage source Vdd2. The NMOS transistors 90 and 96 are thus turned off without any charge couple characteristics and leakage current paths to affect the normal operation.

When electrostatic discharge occurs, using a positive stress to Vss as an example, the first voltage source Vdd1, the second voltage source Vdd2 and the voltage source pad 200 (can be Vdd1 or Vdd2) are all in floating state (under abnormal operation). The NMOS transistors 86 and 88 are in an off state. Thus, in a transient period of time, the NMOS transistor 96 is turned off, and the gate thereof is in floating state. The positive stress voltage input from the I/O pad 82 is coupled to the gate of the NMOS transistor 90 via the parasitic capacitor 202 between the drain region and gate of the NMOS transistor 90. The parasitic bipolar device of the NMOS transistor 90 is thus turned on in advance to provide a discharge path of the positive stress voltage from the I/O pad 82 through the NMOS transistor 90 to the ground voltage Vss.

On the other hand, the forward bias characteristics of the parasitic diode 204 of the NMOS transistor 96 causes the positive stress voltage from the I/O pad 82 to couple via the parasitic diode 204 to the voltage source pad 200. That is, the parasitic diode 204 of the NMOS transistor 96 provides a couple path.

Furthermore, as the positive stress voltage conducted to the voltage source pad 200 is to be directed to the gate of the NMOS transistor 86 or the gate of the NMOS transistor 88. This depends on whether the voltage source pad 200 is coupled to the first voltage source Vdd1 or the second voltage source Vdd2. Therefore, even with the couple effect of the parasitic diode 204, only one of the NMOS transistors 86 and 88 is to be turned on without affecting the NMOS transistor 90. Thus, the gate of the NMOS transistor 90 is still in a floating state. According to the second embodiment of the invention, using the charge couple characteristics of the parasitic capacitor 202, the parasitic bipolar device of the NMOS transistor 90 can be turned on in advance to enhance the protection performance of the electrostatic discharge.

Again, a similar result occurs for applying a negative stress on the voltage source pad 200. When electrostatic discharge of negative stress occurs, the parasitic diode 206 of the NMOS transistor 90 provides a voltage couple path. However, the couple effect of the parasitic diode 206 does not affect the NMOS transistors 92 and 94 Thus, the gate of the NMOS transistor 96 is still in a floating state. Therefore, the circuit structure of the second embodiment uses the charge couple characteristics of the parasitic capacitor 208 between the source region and the gate of the NMOS transistor 96 to turn on the parasitic bipolar device of the NMOS transistor 96. The negative stress voltage from the I/O pad 82 is thus discharged from the NMOS transistor 96 to the voltage source pad 200. The discharge performance is thus enhanced.

It is worth noting that the multiple sources electrostatic discharge protection circuit can be formed on a N-type epitaxy wafer. Since both the NMOS transistors 90 and 96 have P-well for isolation, therefore, the effect of P+ epi-wafer upon of the PMOS transistors 74 and 76 is minimized. In addition, the invention uses the concept of charge couple to greatly enhance the protection performance. During the implantation step for electrostatic static discharge (ESD implant), the NMOS transistors 90 and 96 that provide a path for discharge can use an identical photomask, so that the robustness for both Vss and Vdd ESD is enhanced.

As a conclusion, the invention provides a multiple sources electrostatic discharge protection circuit that can be used for N-type or P-type substrate of epitaxy wafer. The concept of charge couple is applied when the electrostatic discharge occurs. As a result, no matter whether a positive stress is connected to a ground voltage or a negative stress is connected to a voltage source pad, the discharge path is provided by a parasitic bipolar device of a transistor that is turned on in advance. The electrostatic discharge protection is greatly enhanced.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A multiple sources electrostatic discharge protection circuit disposed between an I/O pad and an internal circuit, comprising:
    a first NMOS transistor, comprising a drain region coupled to the I/O pad and a gate coupled to a first voltage source;
    a second NMOS transistor, comprising a drain region coupled to a source region of the first NMOS transistor and a gate coupled to a second voltage source;
    a third NMOS transistor, comprising a drain region coupled to a voltage source pad and a gate coupled to the first voltage source;
    a fourth NMOS transistor, comprising a drain region coupled to a source region of the third NMOS transistor and a gate coupled to the second voltage source;
    a first PMOS transistor, comprising a source region coupled to the I/O pad, a gate coupled to a source region of the second NMOS transistor and a drain region coupled to a ground voltage; and
    a second PMOS transistor, comprising a source region coupled to the voltage source pad, a gate coupled to a source region of the fourth NMOS transistor and a drain region coupled to the I/O pad; wherein
    the voltage source pad is coupled to either the first voltage source or the second voltage source.

2. The protection circuit according to claim 1, wherein the protection circuit can be used in a P-type substrate of epitaxy wafer.

3. A multiple sources electrostatic discharge protection circuit disposed between an I/O pad and an internal circuit, comprising:
    a first NMOS transistor, comprising a gate coupled to a first voltage source;
    a second NMOS transistor, comprising a drain region coupled to a source region of the first NMOS transistor, a gate coupled to a second voltage source and a source region coupled to a ground voltage;
    a third NMOS transistor, comprising a gate coupled to the first voltage source;
    a fourth NMOS transistor, comprising a drain region coupled to a source region of the third NMOS transistor, a gate coupled to the second voltage source and a source region coupled to the ground voltage;
    a fifth NMOS transistor, comprising a drain region coupled to the I/O pad, a gate coupled to a drain region of the first NMOS transistor and a source region coupled to the ground voltage; and
    a sixth NMOS transistor, comprising a drain region coupled to the voltage source pad, a gate coupled to a drain region of the third NMOS transistor and a source region coupled to the I/O pad;
    wherein the voltage source pad is coupled to one of the first and the second voltage sources.

4. The protection circuit according to claim 3, wherein the multiple sources electrostatic discharge protection circuit is applicable for being used for an N-type substrate of epitaxy wafer.

* * * * *